United States Patent
Keeth

(10) Patent No.: US 9,214,449 B2
(45) Date of Patent: Dec. 15, 2015

(54) RECONFIGURABLE CONNECTIONS FOR STACKED SEMICONDUCTOR DEVICES

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 984 days.

(21) Appl. No.: 13/367,026

(22) Filed: Feb. 6, 2012

(65) Prior Publication Data

US 2012/0133387 A1 May 31, 2012

Related U.S. Application Data

(62) Division of application No. 12/900,286, filed on Oct. 7, 2010, now Pat. No. 8,134,378, which is a division of application No. 11/873,118, filed on Oct. 16, 2007, now Pat. No. 7,816,934.

(51) Int. Cl.

| | |
|---|---|
| *G01R 31/26* | (2014.01) |
| *H01L 25/065* | (2006.01) |
| *G11C 5/02* | (2006.01) |
| *G11C 5/06* | (2006.01) |
| *G11C 29/02* | (2006.01) |
| *G11C 29/00* | (2006.01) |

(Continued)

(52) U.S. Cl.
CPC .............. *H01L 25/0657* (2013.01); *G11C 5/02* (2013.01); *G11C 5/06* (2013.01); *G11C 29/02* (2013.01); *G11C 29/022* (2013.01); *G11C 29/70* (2013.01); *G11C 5/04* (2013.01); *G11C 2029/3202* (2013.01); *H01L 2225/06513* (2013.01); *H01L 2225/06517* (2013.01); *H01L 2225/06541* (2013.01); *H01L 2225/06596* (2013.01); *H01L 2924/0002* (2013.01); *H01L 2924/1531* (2013.01)

(58) Field of Classification Search
CPC .................. G01R 31/3177; G01R 31/318536; G01R 31/318513; G01R 31/318558; G01R 31/318572; G11C 29/02; G11C 29/70; G11C 5/06; H01L 25/0657
See application file for complete search history.

(56) References Cited

U.S. PATENT DOCUMENTS

| | | |
|---|---|---|
| 5,255,227 A | 10/1993 | Haeffele |
| 5,448,511 A | 9/1995 | Paurus et al. |
| 5,724,365 A | 3/1998 | Hsia et al. |

(Continued)

FOREIGN PATENT DOCUMENTS

| | | |
|---|---|---|
| CN | 1716598 A | 1/2006 |
| JP | 59153183 A | 9/1984 |

(Continued)

OTHER PUBLICATIONS

Chinese Application Serial No. 200880111949.1, Office Action mailed May 5, 2014, w/English Translation, 7 pgs.

(Continued)

*Primary Examiner* — Tung X Nguyen
(74) *Attorney, Agent, or Firm* — Schwegman Lundberg & Woessner, P.A.

(57) ABSTRACT

Some embodiments include apparatus, systems, and methods comprising semiconductor dice arranged in a stack, a number of connections configured to provide communication among the dice, at least a portion of the connections going through at least one of the dice, and a module configured to check for defects in the connections and to repair defects the connections.

18 Claims, 9 Drawing Sheets

(51) Int. Cl.
*G11C 5/04* (2006.01)
*G11C 29/32* (2006.01)

(56) References Cited

U.S. PATENT DOCUMENTS

| | | | |
|---|---|---|---|
| 5,815,427 | A | 9/1998 | Cloud et al. |
| 6,052,287 | A | 4/2000 | Palmer et al. |
| 6,081,463 | A | 6/2000 | Shaffer et al. |
| 6,367,042 | B1 | 4/2002 | Phan et al. |
| 6,590,409 | B1 | 7/2003 | Hsiung et al. |
| 6,651,202 | B1 | 11/2003 | Phan |
| 6,876,221 | B2 | 4/2005 | Ishigaki |
| 6,914,259 | B2 | 7/2005 | Sakiyama et al. |
| 7,352,067 | B2 * | 4/2008 | Fukaishi et al. ............... 257/777 |
| 7,526,698 | B2 | 4/2009 | Dalton et al. |
| 7,816,934 | B2 | 10/2010 | Keeth |
| 8,134,378 | B2 | 3/2012 | Keeth |
| 8,645,777 | B2 * | 2/2014 | Zimmerman ................. 714/724 |
| 2002/0047192 | A1 | 4/2002 | Inoue et al. |
| 2002/0132382 | A1 | 9/2002 | Hebert et al. |
| 2004/0049720 | A1 | 3/2004 | Boehler |
| 2004/0155327 | A1 | 8/2004 | Cobbley et al. |
| 2004/0230851 | A1 | 11/2004 | Chao et al. |
| 2006/0001176 | A1 | 1/2006 | Fukaishi et al. |
| 2006/0002205 | A1 | 1/2006 | Mimoto et al. |
| 2006/0273438 | A1 | 12/2006 | Anderson et al. |
| 2007/0132085 | A1 | 6/2007 | Shibata et al. |
| 2008/0054488 | A1 | 3/2008 | Leddige et al. |
| 2008/0220565 | A1 | 9/2008 | Hsu et al. |
| 2009/0096478 | A1 | 4/2009 | Keeth |
| 2011/0018574 | A1 | 1/2011 | Keeth |

FOREIGN PATENT DOCUMENTS

| | | | |
|---|---|---|---|
| JP | 2174185 | A | 7/1990 |
| JP | 09008420 | A | 1/1997 |
| JP | 9191074 | A | 7/1997 |
| JP | 1063804 | A | 3/1998 |
| JP | 2000251499 | A | 9/2000 |
| JP | 2003185710 | A | 7/2003 |
| JP | 2006019328 | A | 1/2006 |
| JP | 2007158237 | A | 6/2007 |
| JP | 2007188620 | A | 7/2007 |
| TW | I388861 | B | 3/2013 |
| WO | WO-2009051716 | A2 | 4/2009 |
| WO | WO-2009051716 | A3 | 4/2009 |

OTHER PUBLICATIONS

Chinese Application Serial No. 200880111949.1, Office Action mailed Aug. 21, 2013, w/English Translation, 11 pgs.
Chinese Application Serial No. 200880111949.1, Response filed Jan. 2, 2014 to Office Action mailed Aug. 21, 2013, w/English Claims, 14 pgs.
Chinese Application Serial No. 200880111949.1, Response filed May 14, 2013 to Office Action mailed Mar. 5, 2013, w/English Claims, 14 pgs.
European Application Serial No. 08840720.0, Examination Notification Art. 94(3) mailed Oct. 22, 2013, 4 pgs.
European Application Serial No. 08840720.0, Response filed Apr. 29, 2014 to Examination Notification Art. 94(3) mailed Oct. 22, 2013, 7 pgs.
Japanese Application Serial No. 2010-529935, Response filed Apr. 24, 2013 to Office Action mailed Feb. 5, 2013, w/English Claims, 19 pgs.
"Chinese Application Serial No. 200880111949.1, Office Action mailed Oct. 28, 2011", 14 pgs.
"European Application Serial No. 08840720.0, Office Action mailed Dec. 30, 2011", 6 pgs.
"International Application Serial No. PCT/US2008/011753, Search Report mailed May 27, 2009".
"International Application Serial No. PCT/US2008/011753, Written Opinion mailed May 27, 2009".
Chinese Application Serial No. 200880111949.1 Response filed Jan. 27, 2015 to Office Action mailed Nov. 15, 2014, With the English claims, 11 pgs.
Chinese Application Serial No. 200880111949.1, Office Action mailed Nov. 15, 2014, W/ English Translation, 5 pgs.
Korean Application Serial No. 10-2010-7010684 Response filed Feb. 12, 2015 to Office Action mailed Dec. 19, 2014, With the English claims, 19 pgs.
Korean Application Serial No. 10-2010-7010684, Office Action mailed Dec. 19, 2014, W/ English Translation, 7 pgs.
Chinese Application Serial No. 200880111949.1, Office Action mailed Mar. 5, 2013, w/English Translation, 11 pgs.
Chinese Application Serial No. 200880111949.1, Office Action mailed Aug. 7, 2012, 9 pgs.
Chinese Application Serial No. 200880111949.1, response filed Dec. 20, 2012 to Office Action mailed Aug. 7, 2012, 10 pgs.
Chinese Application Serial No. 200880111949.1, Response filed Mar. 12, 2012 to Office Action mailed Oct. 28, 2011, 12 pgs.
European Application Serial No. 08840720.0, Response filed Jul. 25, 2012 to Extended European Search Report mailed Dec. 30, 2011, 10 pgs.
International Application Serial No. PCT/US2008/011753, International Preliminary Report on Patentability mailed Apr. 29, 2010, 10 pgs.
Japanese Application Serial No. 2010-529935, Office Action mailed Feb. 5. 2013, 8 pgs.
Taiwanese Application Serial No. 097139742, Office Action mailed Apr. 5, 2012, w/ English Translation, 13 pgs.
Taiwanese Application Serial No. 097139742, Response filed Oct. 4, 2012 to Office Action mailed Apr. 5, 2012, 10 pgs.
Chinese Application Serial No. 200880111949.1, Office Action mailed Mar. 11, 2015, 4 pgs.

* cited by examiner

RECONFIGURABLE CONNECTIONS FOR STACKED SEMICONDUCTOR DEVICES

PRIORITY APPLICATIONS

This application is a divisional of U.S. application Ser. No. 12/900,286, filed Oct. 7, 2010, now U.S. Pat. No. 8,134,378 which is a divisional of U.S. application Ser. No. 11/873,118, filed Oct. 16, 2007, now issued as U.S. Pat. No. 7,816,934, both of which are incorporated herein by reference in their entirety.

BACKGROUND

Semiconductor devices, including memory, often are used in computers and other electronic products, e.g., digital televisions, digital cameras, and cellular phones, to store data and other information. A semiconductor device such as a memory device usually has many components and associated circuit connections to transfer information to and from the components. Some memory device may be formed on multiple semiconductor dice.

DETAILED DESCRIPTION

Figure 1:
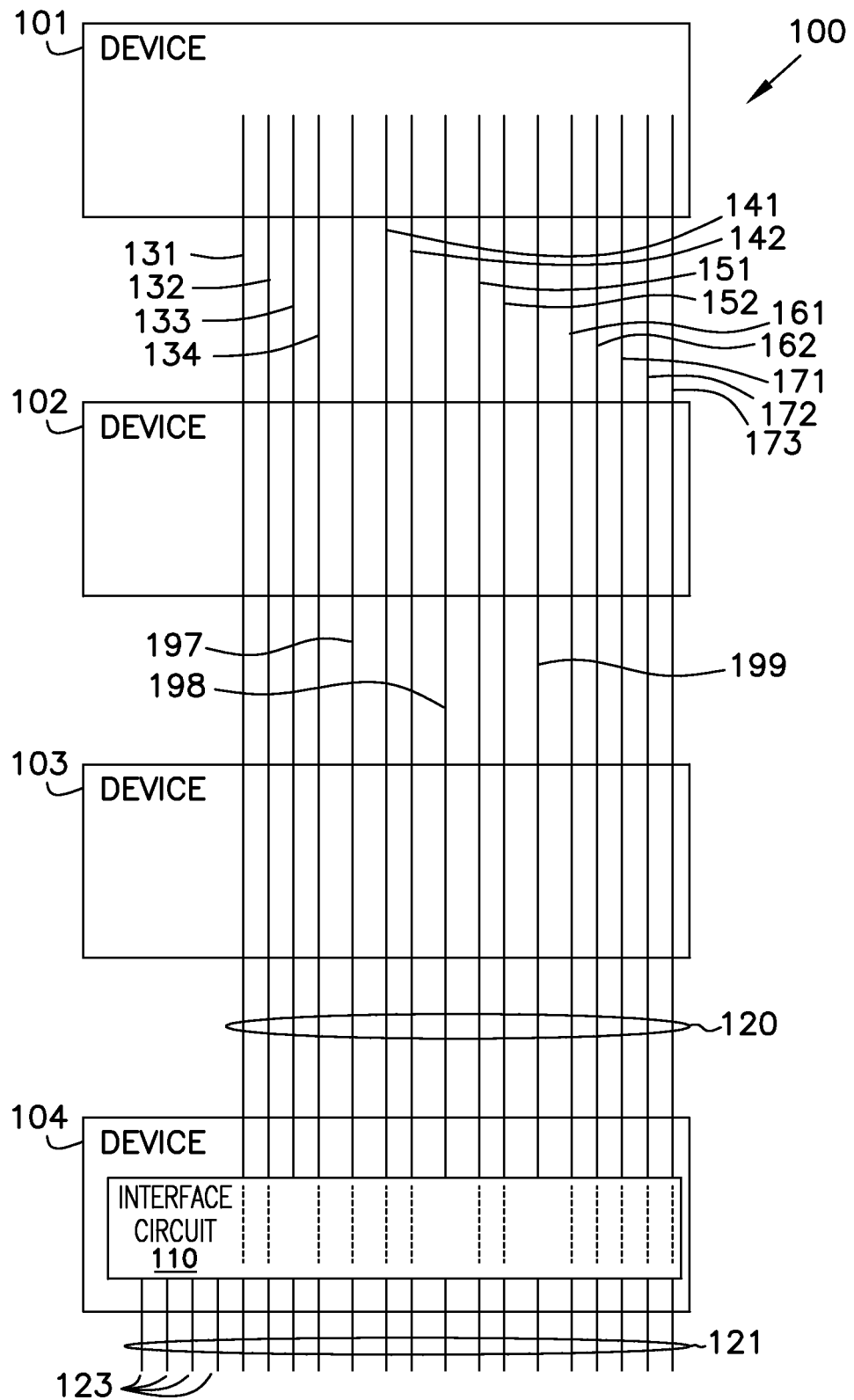
FIG. 1 shows block diagram of an apparatus including devices and connections according to an embodiment of the invention.

FIG. 1 shows a block diagram an apparatus 100 including devices 101, 102, 103, and 104, and connections 120 and 121 according to an embodiment of the invention. Connections 120 and 121 may include electrically conductive connections. Devices 101, 102, 103, and 104 may communicate with each other through connections 120 and with other external devices (e.g., a processor, a memory controller, or other) through an interface circuit 110.

FIG. 1 shows devices 101, 102, 103, and 104 in block diagram. In reality, these devices may be physically arranged in a stack and connections 120 and 121 may correspond to conductive paths that run through these devices. The inventor has noticed that factors such as mechanical defects, electrical defects, or both may render one or more portions of connections 120 and 121 useless. Thus, the inventor has invented, as described below, a variety of apparatus, systems, and methods to check for defects and repair defects so that discarding the entire stack may be avoided and yield may be improved.

In FIG. 1, apparatus 100 may use connections 120 and 121 to transfer information such as data, address, control and other information. Connections 121 may include many portions such as portions 131, 132, 133, 134, 141, 142, 151, 152, 161, 162, 171, 172, 173, 197, 198, and 199. Each of these portions may include an electrical conductive path. Connections 121 may include connections 120 and additional portions 123. Besides using connections 120 to transfer information among devices 101, 102, 103, and 104, apparatus 100 may use additional portions 123 to transfer additional information (e.g., additional data and control information and other) between interface circuit 110 and an external device (e.g., a processor, a memory controller, or other).

Each of portions 131, 132, 133, 134, 141, 142, 151, 152, 161, 162, 171, 172, 173, 197, 198, and 199 may include a conductive path to transfer information. These portions may form different buses to transfer different types of information. For example, portions 131, 132, 133, and 134 may form a data bus to transfer information representing data to be stored into or data read from devices 101, 102, 103, and 104. Portions 141 and 142 may form an address bus to transfer information representing address of locations in devices 101, 102, 103, and 104 where the data may be stored. Portions 151 and 152 may form a control bus to transfer control information to control operations of apparatus 100. Portions 161 and 162 may form a supply power bus to provide power (e.g., voltages Vcc and Vss, Vss may include ground) to devices 101, 102, 103, and 104. Portions 171, 172, and 173 may form a bus for providing information (e.g., test bits) to check for defects in connections 120 and 121 in apparatus 100.

Portions 197, 198, and 199 may correspond to spare portions. Apparatus 100 may use portions 197, 198, and 199 to repair one or more defective portions in connections 120 and 121. Apparatus 100 may include circuitry and activities (similar to or identical to those described below with reference to FIG. 2 through FIG. 9) to check for defects and repair defects in connections 120 and 121.

FIG. 1 shows connections 120 and 121 with specific number of portions as an example. The number of portions of connections 120 and 121 may vary. For example, connections 120 may include tens, hundreds, or thousands of portions such that connections 120 may include hundreds or thousands of conductive paths going through the dice in a stack. FIG. 1 shows an example where portions 197, 198, and 199 (may be used as spare portions) are being scattered among other portions. The locations of portions 197, 198, and 199, however, may be anywhere within connections 120 and 121.

In FIG. 1, apparatus 100 may include only a single memory device such that various parts of the single memory device may be distributed among devices 101, 102, 103, and 104 where each of devices 101, 102, 103, and 104 may include only a part of (not the entire of) the single memory device. Apparatus 100 may also include a multiple memory devices where each of devices 101, 102, 103, and 104, by itself, may include a memory device. Thus, apparatus 100 may include, e.g., four memory devices, one memory device in each of devices 101, 102, 103, and 104.

Each of devices 101, 102, 103, and 104 of apparatus 100 may include a part of a memory device or the entire memory device such as the memory device shown in FIG. 2 through FIG. 9 below.

Figure 2:
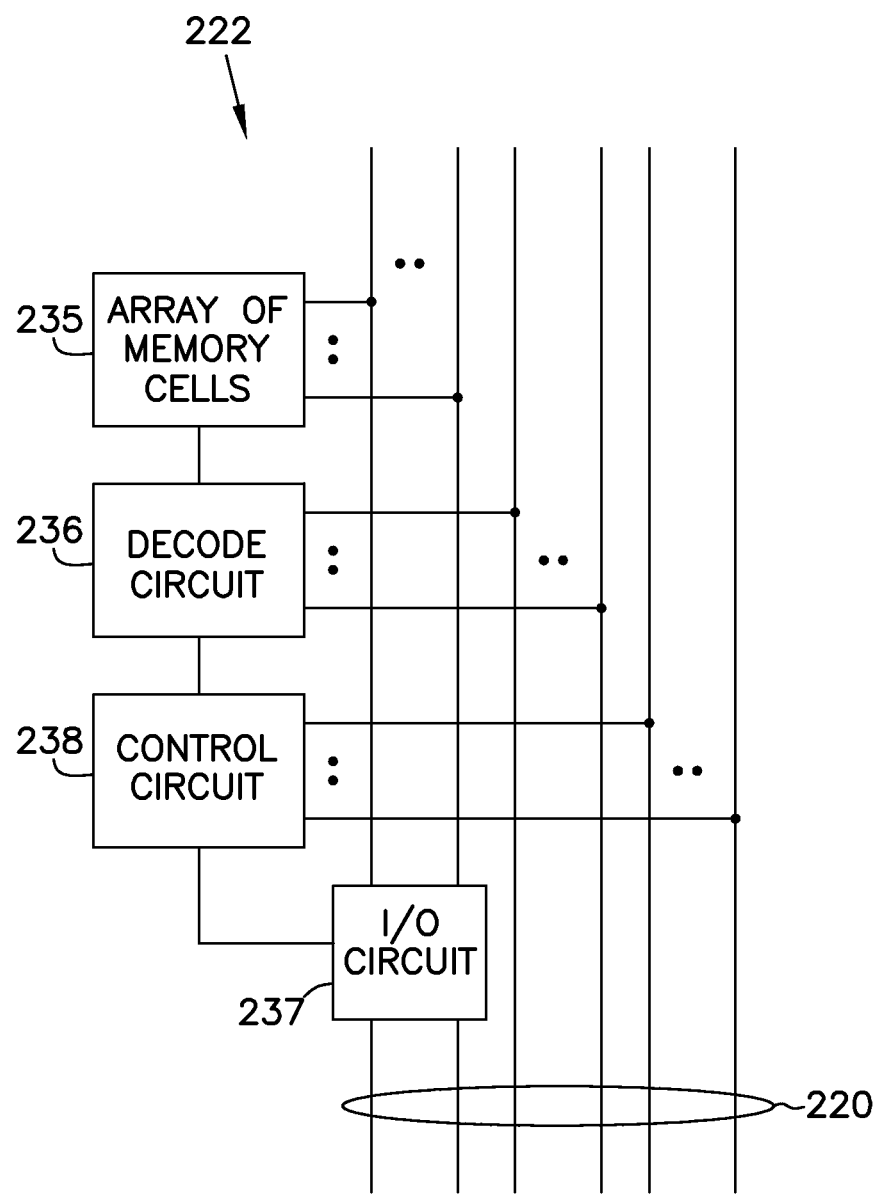
FIG. 2 shows a block diagram of a memory device with connections according to an embodiment of the invention.

FIG. 2 shows a block diagram of a memory device 222 with connections 220 according to an embodiment of the invention. Memory device 222 may be associated with one or more of devices 101, 102, 103, and 104 of FIG. 1. Connections 220 of FIG. 2 may be associated with connections 120 of FIG. 1. As shown in FIG. 2, memory device 222 may include an array of memory cells 235 to store information, a decode circuit 236 to access array of memory cells 235, an I/O (input/output) circuit 237 to transfer information to and from memory array of memory cells 235, and a control circuit 238 to control operations of memory device 222 such as read and write operations. Memory device 222 may include a dynamic random access memory (DRAM) device, a static random access memory (SRAM) device, flash memory device, or other memory devices, or a combination of these memory devices. A person skilled in the art would readily recognize that memory device 222 may include other components, which are not shown to help focus on the embodiments described herein. In some cases, some components of memory device 222 may be distributed among multiple semiconductor dice of the same stack of dice. For example, array of memory cells 235 and decode circuit 236 may be distributed at only one die, and at least a part of I/O circuit 237 and control circuit 238 may be distributed at one or more additional die.

Figure 3:
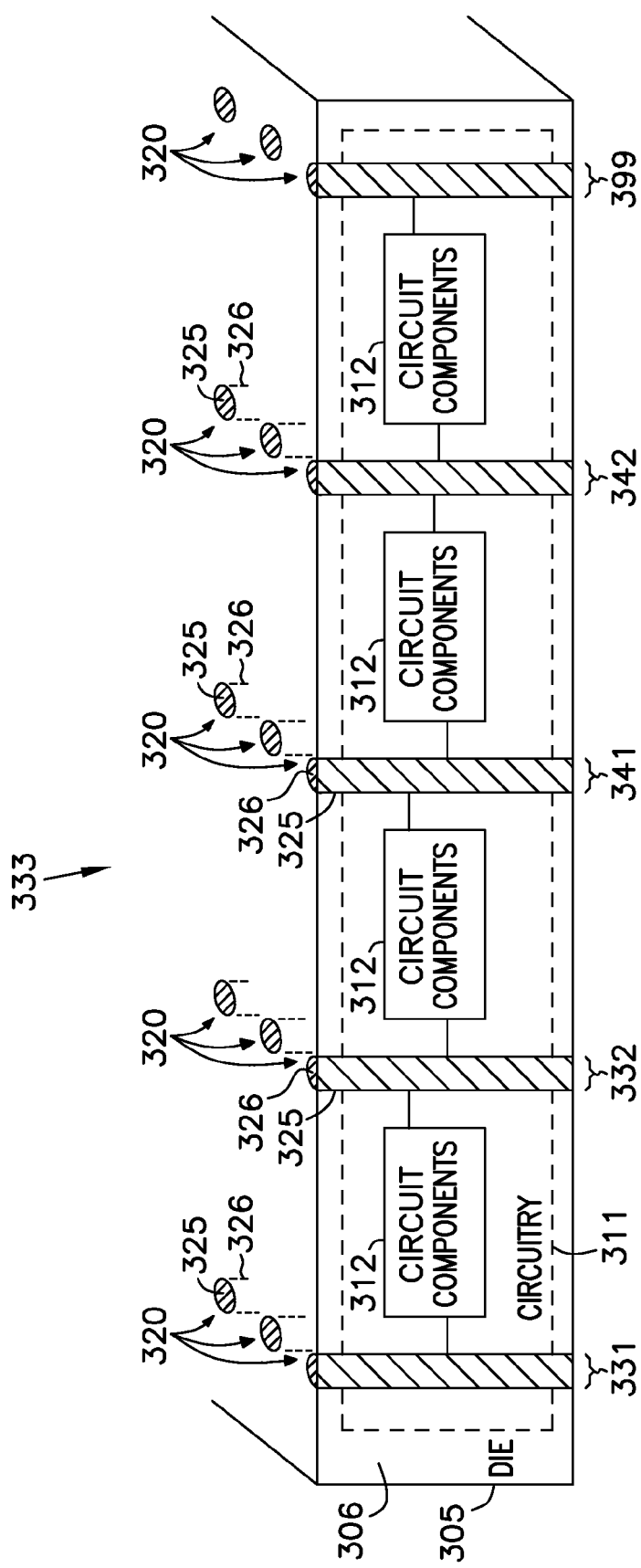
FIG. 3 shows a partial cross section of a memory device having a die and connections according to an embodiment of the invention.

Memory device 222 may include at least one die and connections such as the die and connections shown in FIG. 3.

FIG. 3 shows a partial cross section of a memory device 333 having a die 305 and connections 320 according to an embodiment of the invention. Memory device 333 may include circuitry 311. For clarity, FIG. 3 shows connections 320 in cross-section illustration and circuitry 311 in block diagram illustration. The features in the drawings in this disclosure may be shown in exaggerated dimensions. Some or all features shown in the drawings may not have section line symbols (cross-hatch lines) when the features are shown in a cross section view.

In FIG. 3, connections 320 may correspond to connections 120 of FIG. 1 and connections 220 of FIG. 2. Die 305 of FIG. 3 may include semiconductor material (e.g., silicon) 306 where circuitry 311 may be formed. Circuitry 311 may include circuit components 312, which may include an array of memory cells, a decode circuit, a control circuit, and other circuit components, of memory device 333. Memory device 333 may use connections 320 to transfer information to and from circuit components 312. Connections 320 may include a number of vias 325 (sometimes called through holes) extending through die 305 as shown in FIG. 3. Vias 325 may be filled with conductive material 326 to form a number of portions of connections 320, such as portion 331, 332, 341, 342, and 399. Memory device 333 may be formed using techniques known to those skilled in the art. For example, connections 120 including vias 325 may be formed by etching through die 305 or by applying a laser to die 305. After vias 325 are formed, conductive material, such as polysilicon, metal (e.g., copper), or metal alloy, may fill vias 325 to form connections 320.

FIG. 3 shows memory device 333 having one die, such as die 305, as an example. Memory device 333 may include multiple dice arranged in a stack and covered by an integrated circuit (IC) package, such as the memory device shown in FIG. 4.

Figure 4:
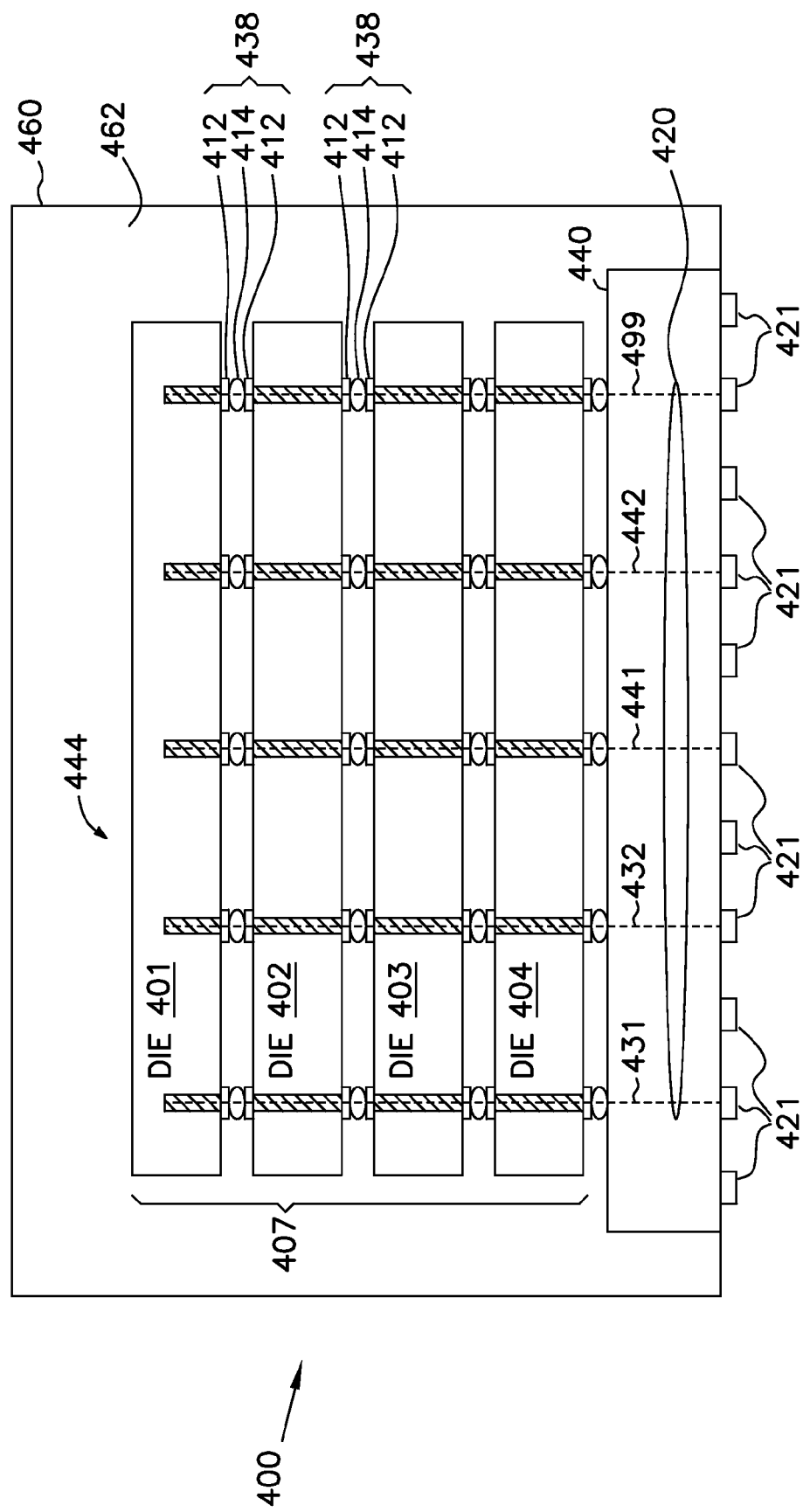
FIG. 4 shows a partial cross section of an IC package having dice arranged in a stack and connections going through the dice according to an embodiment of the invention.

FIG. 4 shows a partial cross section of an IC package 400 having dice 401, 402, 403, and 404 arranged in a stack 407 and connections 420 going through the dice according to an embodiment of the invention. IC package 400 may also be called an IC chip where dice 401, 402, 403, and 404 are inside the IC chip. Dice 401, 402, 403, and 404 may form a memory device 444. Each of dice 401, 402, 403, and 404 may include a die similar to or identical to die 305 of FIG. 3. Thus, each of dice 401, 402, 403, and 404 may include circuitry with circuit components such as memory cells, decode circuits, control circuits, and others that are similar to or identical to circuitry 311 and circuit components 312 of memory device 333 of FIG. 3 or to those of memory device 222 of FIG. 2. For clarity, FIG. 4 omits circuitry and circuit components of memory device 444.

IC package 400 may include a support 440 coupled to memory device 444. Support 440 may include a ceramic or organic package substrate. Contacts 421 may be coupled to support 440 to enable memory device 444 to communicate with another device such as a processor or a memory controller. Contacts 421 may be part of connections such as connections 121 of FIG. 1. In FIG. 4, IC package 400 may include an enclosure 460, which may enclose at least a portion of support 440 and memory device 444 in an interior 462. Interior 462 may be filled with a filling material, a gas, a liquid, or a combination thereof. The filling material may include a polymer material.

As shown in FIG. 4, connection 420 may include a number of portions 431, 432, 441, 442, and 499. For illustration purposes, as shown in FIG. 4, each portion of connection 420 may include a portion having a conductive path (shown as a broken line in FIG. 4) that goes through dice 401, 402, 403, and 404 in stack 407.

As mentioned above, memory device 444 may include circuit components of such as memory cells, decode circuits, control circuits, and others, which are not shown in FIG. 4 but may similar to or identical to those of FIG. 2. Those circuit components of memory device 444 may be distributed among dice 401, 402, 403, and 404. For example, memory cells of memory device 444 may be located only at dice 401, 402, and 403 and not at die 404. Thus, die 404 may not include memory cells like dice 401, 402, and 403. However, die 404 may include a part of a control circuit, a part of an interface circuit, or the entire control circuit and an interface circuit of memory device 444. The interface circuit, which may be located at die 404, may be similar to or identical to interface circuit 110 of FIG. 1. The interface circuit may include circuit component (e.g., buffers and I/O drivers) to accommodate the transfer of information at appropriate data transfer rates between memory device 444 and another device such as a processor or a memory controller.

Dice 401, 402, 403, and 404 may be formed separately, and then the separate dice may be arranged in stack 407 as shown in FIG. 4. Joints 438 may be formed in each portion of connections 420. As shown in FIG. 4, dice 401, 402, 403, and 404 may have an equal size or substantially equal size and may be stacked vertically on, or with respect to support 440. In other words, dice 401, 402, 403, and 404 may be stacked in a direction perpendicular to support 440. Each joint 438 may be located between two dice. Joint 438 may include two bond pads 412 and an electrically conductive material 414. Conductive material 414 may include solder, copper, or a conductive adhesive. Stack 407 of dice 401, 402, 403, and 404 may be formed using techniques known to those skilled in the art. For example, stack 407 may be formed in a flip-chip fashion in which die 401 may be used as a base, then die 402 may be stacked on die 401, then die 403 may be stacked on die 403, and finally die 404 may be stacked on die 403. Conductive material (e.g., solder), such as conductive material 414, may be used to bond the bond pads (e.g., such as bond pads 412) of one die to the bond pads of another die while the dice are stacked. After the dice are stacked, they may be flipped over and then attached (e.g., attach die 404) to a support such as support 440. FIG. 4 shows an example of IC package 400 where memory device 444 is being arranged in a so-called a "flip chip" arrangement. IC package 400, however, may have other arrangements for memory device 444.

In some cases, at least a portion of connections 420 may be defective. For example, at least one of portions 431, 432, 441, 442, and 499 may be relatively highly resistive (e.g., having inadequate filling conductive material to completely fill the vias), open (e.g., gap within the some part of the conductive material), short to ground (e.g., to Vss), or short to supply power (e.g., Vcc), rendering at least one of these portion defective. In an embodiment, IC package 400 includes circuitry to check for defects and to repair defects so that stack 407 may still be usable and avoid being discarded (even if a defective portion may still be present after the repair). Thus, since IC package 400 may include circuitry to check for defects and to repair defects in connections 420, a defective portion of connections 420 may still remain in connections 420 (but may be replaced by a non-defective portion) when one or more circuit components (e.g., memory cells, decode circuits, control circuits, and others) of memory device 444 is in operation. In IC package 400, the circuitry to check for defects and to repair defects may be similar to or identical to those of FIG. 5 through FIG. 7.

Figure 5:
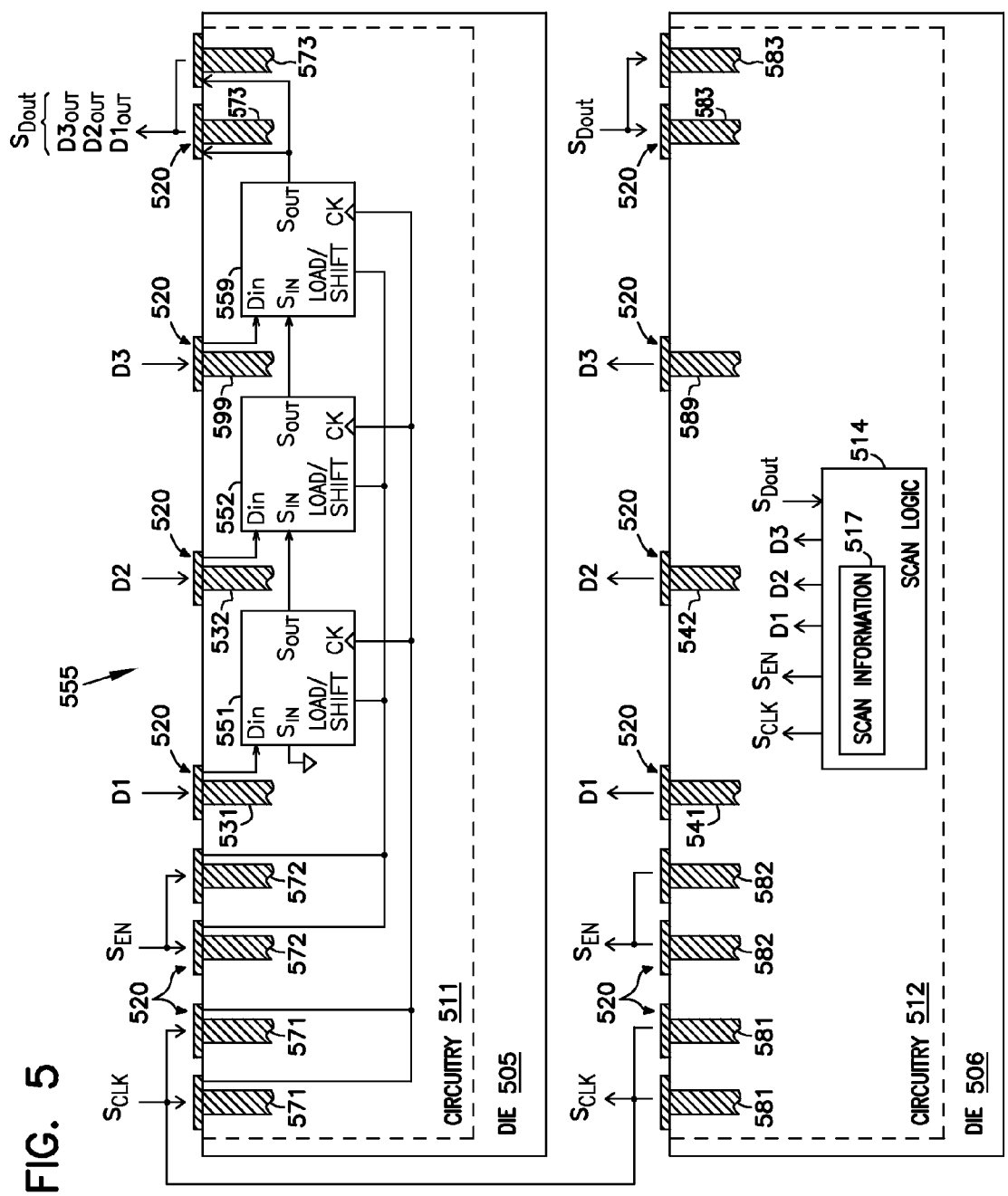
FIG. 5 shows a partial cross section of a memory device with connections and circuitry to check for defects in the connections according to an embodiment of the invention.

FIG. 5 shows a partial cross section of a memory device 555 with connections 520 and circuitry 511 and 512 to check for defects in connections 520 according to an embodiment of the invention. For clarity, FIG. 5 shows connections 520 in cross-section illustration and circuitry 511 and circuitry 512 in block diagram illustration.

Memory device 555 may be associated with memory device 444 of FIG. 4 or may form a part of memory device 444. Thus, memory device 555 may include dice arranged in a stack similar to or identical to stack 407 of memory device 444 of FIG. 4. In FIG. 5 shows memory device 555 with only two dice 505 and 506 as an example. At least some portions of connections 520 and circuitry 511 may be formed on die 505, and at least some other portions of connections 520 and circuitry 512 may be formed on die 506. Each of dice 505 and 506 may be associated with die 305 of FIG. 3 or one of dice 401, 402, 403, and 404 of FIG. 4. Connections 520 in FIG. 5 may correspond to at least some portions of connections 120, 220, 320, or 420 shown in FIG. 1 through FIG. 4. FIG. 5 shows and example where connections 520 may include portions 531, 532, 571, 572, 573, and 599, which may go through die 505 in ways similar to or identical to portions 331, 341, 342, and 399 (FIG. 3) going through die 305. For clarity, FIG. 5 shows only a part of each of portions 531, 532, 571, 572, 573, and 599. Connections 520 may also include portions 541, 542, 581, 582, 583, and 589, which may go through die 506 in ways similar to or identical to portions 331, 341, 342, and 399 (FIG. 3) going through die 305. For clarity, FIG. 5 shows only a part of each of portions 541, 542, 581, 582, 583, and 589. Portions 531, 532, 571, 572, 573, and 599 may be coupled to corresponding portions 541, 542, 581, 582, 583, and 589, respectively, to form a number of conductive paths going through dice 505 and 506. For example, portions 571 may be coupled (symbolically shown as a line coupling between portions 571 and 581 in FIG. 5) to portions 581 to form conductive paths similar to or identical to two of conductive paths (shown as a broken line in FIG. 4) that go through dice 401, 402, 403, and 404 in FIG. 4. In another example, portions 531 may be coupled to portion 541 to form a conductive path similar to a conductive path (shown as a broken line in FIG. 4) that goes through dice 401, 402, 403, and 404 in FIG. 4. For clarity, FIG. 5 shows only one coupling (e.g., a line) between portions 571 and corresponding portions 581. Couplings (e.g., lines) between other portions in FIG. 5 are not shown for clarity. Connections 520 may also include many additional portions, similar to or identical to portions 531, 532, 571, 572, 573, and 599 of die 505 and portions 541, 542, 581, 582, 583, and 589 of die 506, which are omitted from FIG. 5 for clarity.

As shown in FIG. 5, portions 571 may include duplicates portions, which are two instances of the same portions connected to each other and to the same circuit components. Similarly, portions 572, portions 573, portions 581, portions 582, and portions 583 may include duplicate portions. Memory device 555 may use some designated portions of connections 520 to start (or during) a test. Thus, if one or more of the designated portions are defective before the test is started, then the test itself may be difficult to start. In FIG. 5, memory device 555 may use portions 571, 572, 573, 581, 582, and 583 (e.g., used as designated portions) during a test to check for defects in other portions of connections 520. Thus, making duplicates of portions 571, 572, 573, 581, 582, and 583 may allow the test to be performed even if one of portions 571, one of the portions 572, one of the portions 573, one of portions 581, one of the portions 582, and/or one of the portions 583 is defective before the test is started.

In FIG. 5, portion 599 may be used as a spare portion to repair (e.g., to be used for rerouting) a defective portion. For example, portion 599 may be used to replace portion 531 or 532 when portion 531 or 532 is defective. Repairing defects is described below in more details with reference to FIG. 7. In FIG. 5, circuitry 511 and 512 may check for defects in connections 520 as follows.

Circuitry 511 of die 505 may include scan cells 551, 552, and 559. Circuitry 512 may include scan cells similar to or identical to scan cells 551, 552, and 559. Each of scan cells 551, 552, and 559 of circuitry 511 may be coupled to one of portions 531, 532, and 559. FIG. 5 shows an example of memory device 555 having only three portions 531, 532, and 559 with three corresponding scan cells 551, 552, and 559. Memory device 555, however, may include numerous other portions and corresponding scan cells similar to or identical to those shown in FIG. 5.

Circuitry 512 of die 506 may include a scan logic 514. FIG. 5 shows scan logic 514 being located in die 506 as an example. A part of scan logic 514 or the entire scan logic 514 may be located in die 505 or in die 505 plus one or more other dice of memory device 555. Thus, scan logic 514 may be located in one or more dice of memory device 555. Further, instead of being located entirely in memory device 555, at least a part of scan logic 514 may be located in test equipment external to memory device 555. In the description herein, "at least a part of a component" means either only a part of the component or the entire component. For example, "at least a part of a scan logic", such as scan logic 514, means either only a part of the scan logic or the entire scan logic. Thus, in FIG. 5, although scan logic 514 is shown to be located memory device 555, at least a part of scan logic 514 (only a portion of scan logic 514 or the entire scan logic 514) may be located in at least one of memory device 555 and test equipment, meaning that one part of scan logic 514 may be located in memory device 555 and another part of scan logic 514 may be located in test equipment, or the entire scan logic 514 may be located in either memory device 555 or test equipment.

Scan logic 514 may scan connections 520 to check for defects. Scan logic 514 may use scan information 517 during a scan. Scan information 517 may include information such as scan bits (e.g., test bits) where the scan bits may form one or more patterns of bits. The scan bits in scan information 517 may be temporary or permanently stored in scan logic 514. During the check for defects, scan logic 514 may use at least some of the scan bits in scan information 517 as input data bits and transfer the input data bits through one or more portions of connections 520. Scan logic 514 may obtain output data bits (based on the input data bits) at another portion of connections 520, and then compare the values of the input and output data bits to determine whether one or more portions of connections 520 are defective.

Scan cells 551, 552, and 559 may form a parallel-load shift register having a load mode to receive input data bits D1, D2, and D3 at portions 531, 532, and 559, and a shift mode to shift bits D1, D2, and D3 out of the shift register to portion 573. The signal $S_{Dout}$ at portion 573 may represent output data bits $D1_{OUT}$, $D2_{OUT}$, and $D3_{OUT}$. Scan logic 514 may also include signals $S_{CLK}$ and $S_{EN}$.

The $S_{EN}$ signal may be provided to load terminal LOAD/SHIFT of each of enable scan cells 551, 552, and 559 to enable these scan cells to be in either a load mode or a shift mode during checking for defects in portions 531, 532, and 599. For example, scan cells 551, 552, and 559 may be in a load mode when the $S_{EN}$ signal has a first signal level (e.g., low). Scan cells 551, 552, and 559 may be in a shift mode when the $S_{EN}$ signal has a second signal level (e.g., high). In the load mode, bits D1, D2, and D3 may be provided (e.g., loaded) in parallel to scan cells 551, 552, and 559 at corresponding input Din of each scan cell. Thus, in the load mode, scan cells 551, 552, and 559 may contain bits D1, D2, and D3, respectively. And then in the shift mode, scan cells 551, 552, and 559 may shift bits D1, D2, and D3 one-by-one (e.g., from left to right of FIG. 5) to portion 573, at which bits $D1_{OUT}$, $D2_{OUT}$, and $D3_{OUT}$ may be obtained (e.g., obtained by scan logic 514).

The $S_{CLK}$ in FIG. 5 signal may represent a clock signal and may be provided to a clock terminal CK of each of scan cells 551, 552, and 559. The $S_{CLK}$ signal may repeatedly toggle to allow these scan cells to shift bits D1, D2, and D3 one-by-one to portion 573. For example, when scan cells 551, 552, and 559 are in a shift mode, the $S_{CLK}$ signal may toggle three times to allow scan cells 551, 552, and 559 to shift three bits serially through terminals $S_{IN}$ and $S_{OUT}$ of scan cells 551, 552, and 559 and then to portion 573.

The $S_{Dout}$ signal (which represents bits $D1_{OUT}$, $D2_{OUT}$, and $D3_{OUT}$) at portion 573 may feed scan logic 514 so that scan logic 514 may compare the values of bits $D1_{OUT}$, $D2_{OUT}$, and $D3_{OUT}$ with the values of bits D1, D2, and D3 to determine if any one of portions 531, 532, and 599 may be defective. For example, if the values of bits $D1_{OUT}$, $D2_{OUT}$, and $D3_{OUT}$ are matched with the values of bits D1, D2, and D3, then none of portions 531, 532, and 599 are defective. If the values of bits $D1_{OUT}$, $D2_{OUT}$, and $D3_{OUT}$ are unmatched with the values of bits D1, D2, and D3, then one or more of portions 531, 532, and 599 may be defective.

Figure 6:
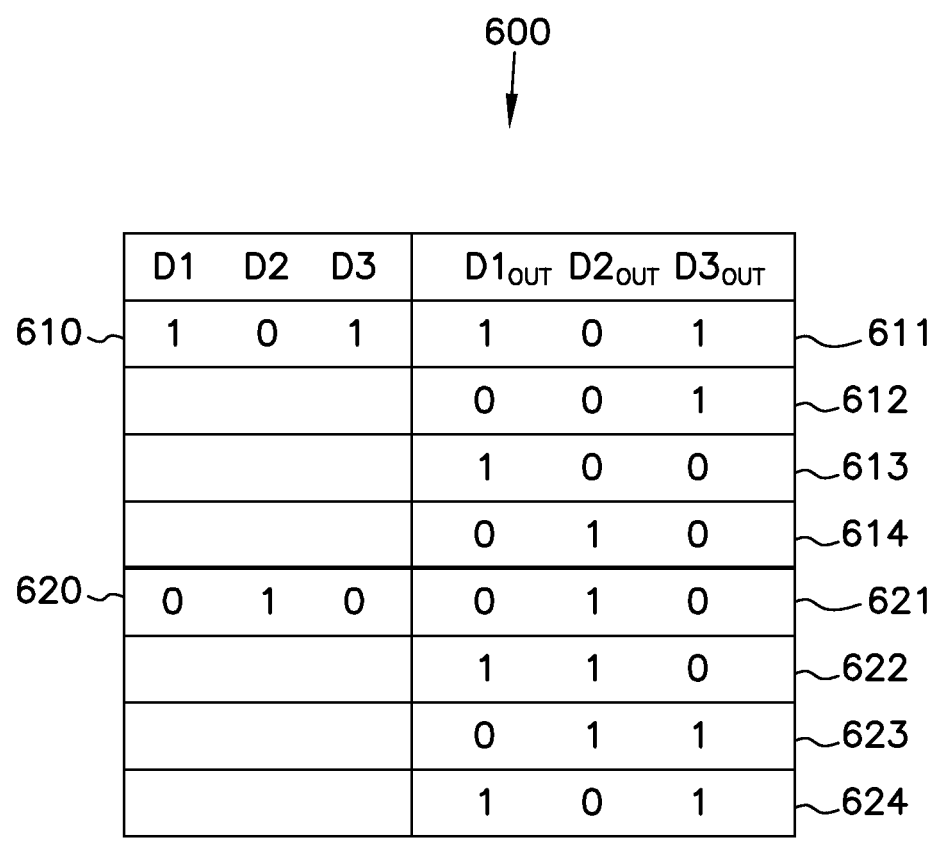
FIG. 6 is a table showing example values of bits used during checking for defects in connections of the memory device of FIG. 5.

FIG. 6 is a table 600 showing example values of bits D1, D2, D3 and bit $D1_{OUT}$, $D2_{OUT}$, and $D3_{OUT}$ used during checking for defects in connections 520 of memory device 555 of FIG. 5. As shown in table 600, bits D1, D2, and D3 (input bits) may have two different example values 610 and 620 (input values) that may be provided to portions 531, 532, and 599 of connections 520 (FIG. 5) at two different times corresponding to two different scan examples. Each of values 610 and 620 may include a number of (e.g., three) binary digits where each of the binary digits may include either "0" or "1" bit value. During one scan, value 610 with three bits with values of "1", "0", and "1" may be provided to portions 531, 532, and 599, respectively. During another scan, value 620 with three bits with values of "0", "1", and "0" may be provided to portions 531, 532, and 599, respectively.

Table 600 also shows various possible values of bits $D1_{OUT}$, $D2_{OUT}$, and $D3_{OUT}$ (output bits) that may be obtained during a scan. For example, values 611, 612, 613, or 614 (output values) may be obtained during a scan where bits D1, D2, and D3 having value 610 are provided to connections 520. In another example, values 621, 622, 623, or 624 may be obtained during another scan where bits D1, D2, and D3 having value 620 are provided to connections 520. In table 600, the value of bit $D1_{OUT}$ is obtained based on the value of bit D1, the value of bit $D2_{OUT}$ is obtained based on the value of bit D1, and the value of bit $D3_{OUT}$ is obtained based on the value of bit D3.

Circuit 511 (FIG. 5) may determine which portion (if any) of connections 520 is defective based on a bit-to-bit comparison between value 610 and a corresponding value 611, 612, 613, or 614. Similarly, circuit 511 may also determine which portion (if any) of connections 520 is defective based on a bit-to-bit comparison between each bit of value 620 with a corresponding bit of value 621, 622, 623, or 624.

For example, if value 610 of FIG. 6 is provided to portions 531, 532, and 599 during a scan and value 611 is obtained, then none of portions 531, 532, and 599 are defective because values 610 and 611 are matched. However, if value 610 is provided to portions 531, 532, and 599 during a scan and value 612, 613, or 614 is obtained, then one of portions 531, 532, and 599 may be defective because value 610 and each of values 612, 613, and 614 are unmatched. For example, if value 610 is provided to portions 531, 532, and 599 and value 612 is obtained, then portion 531 may be defective because the value of bit D1 (provided to portion 531) is "1" but the value of bit $D1_{OUT}$ is "0", which is unmatched the value "0" of bit D1. In another example, if value 610 is provided to portions 531, 532, and 599 and value 613 is obtained, then portion 599 may be defective because the value of bit D3 (provided to portion 599) is "1" but the value of bit $D3_{OUT}$ is "0", which is unmatched the value "1" of bit D3. In another example, if value 610 is provided to portions 531, 532, and 599 and value 614 is obtained, then portion 532 may be defective because the value of bit D2 (provided to portion 532) is "0" but the value of bit $D2_{OUT}$ is "1", which is unmatched the value "0" of bit D2.

Similarly to the examples above, if value 620 is provided to portions 531, 532, and 599 during a scan and value 621 is obtained, then none of portions 531, 532, and 599 are defective because values 620 and 621 are matched. However, if value 612, 613, or 614 is obtained, then one of portions 531, 599, or 532 may be defective because value 620 ("0", "1", "0") and each of values 622 ("1", "1", "0"), 623 ("0", "1", "1"), and 624 ("1", "0", "1") are unmatched.

In the above examples, table 600 shows only some values of D1, D2, and D3 and some values of $D1_{OUT}$, $D2_{OUT}$, and $D3_{OUT}$. Other values (e.g., other binary combinations) of D1, D2, and D3 may be used, and other values of $D1_{OUT}$, $D2_{OUT}$, and $D3_{OUT}$ may be obtained. The other values may include other number of bits (e.g., different from 3 bits) used in the above examples in table 600. If other values are used, scan logic 514 may also determine whether one or more portions of connections 520 may be defective using activities similar to those described in the above examples.

After a portion of connections 520 is determined to be defective, circuitry 511 may replace the defective portion with a non-defective portion (e.g., a spare portion) so that device 555 may still be used and avoid being discarded. For example, if portion 531 is determined to be defective and portion 599 is non-defective, circuitry 511 may replace portion 531 with portion 599. In this example, when memory device 555 is in operation, portion 531 (although it is a defective portion) remains in connections 520 because it is replaced by portion 599 (non-defective portion).

Circuitry 511 may include circuit components (which are not shown in FIG. 5 for clarity) to repair defective portions of connections 520. These circuit components may be similar to or identical to those described below with reference to FIG. 7).

Figure 7:
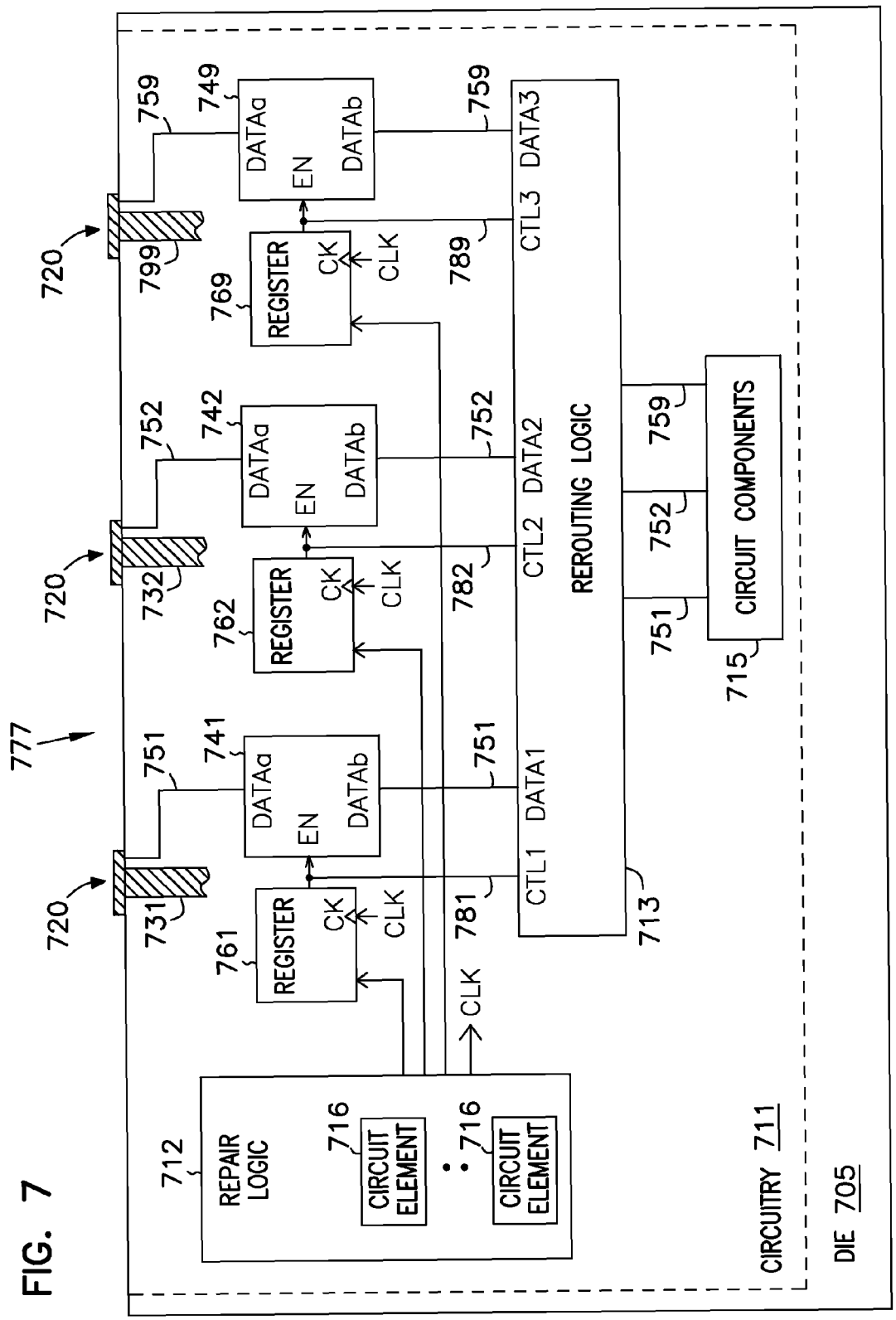
FIG. 7 shows a diagram of a memory device with connections 720 and circuitry to repair defects in connections according to an embodiment of the invention.

FIG. 7 shows a diagram of a memory device 777 with connections 720 and circuitry 711 to repair defects in connection 720 according to an embodiment of the invention. For clarity, FIG. 7 shows connections 720 in cross-section illustration and circuitry 711 in block diagram illustration.

Memory device 777 may be associated with memory device 444 of FIG. 4 or may form a part of memory device 444 of FIG. 4. Thus, memory device 777 may include dice arranged in a stack similar to or identical to stack 407 of memory device 444 of FIG. 4. Memory device 777 may also be associated with memory device 555 of FIG. 5.

Memory device 777 may include a die 705 where at least some portions of connections 720 and circuitry 711 may be formed. Die 705 may be associated with die 305 of FIG. 3, one of dice 401, 402, 403, and 404 of FIG. 4, or die 505 of FIG. 5. Connections 720 in FIG. 7 may correspond to at least some portions of connections 120, 220, 320, 420, or 520 shown in FIG. 1 through FIG. 5. FIG. 7 shows an example where connections 720 may include portions 731, 732, and 799 which may go through die 705 in ways similar to or identical to portions 331, 341, 342, and 399 (FIG. 3) going through die 305. For clarity, FIG. 7 shows only a part of each of portions 731, 732, and 799. Further, connections 720 may include many other portions, which are omitted from FIG. 7 for clarity.

Memory device 777 may include circuit components to check for defects in connections 720 in ways similar to or identical to those of FIG. 5. For example, memory device 777 may include scan cells and scan logic (similar to or identical to scan cells 551, 552, and 559, and scan 514 logic of FIG. 5), which are not shown in FIG. 7 for clarity. As shown in FIG. 7, memory device 777 may include a repair logic 712 and a rerouting logic 713 and to repair defects in connections 720.

Repair logic 712 may set indications to indicate which one of portions 731, 732, and 799 may be a defective portion based on results of the check for defects that may have already performed by components (e.g., scan logic and scan cells) of memory device 777 or by test equipments external to memory device 777.

Rerouting logic 713 may recognize which one of portions 731, 732, and 799 may be a defective portion and appropriately reroute information (e.g., reroute signals) to be transferred on a defective portion of connections 720 to a non-defective (e.g., replacement) portion of connections 720.

Memory device 777 may include circuit units 741, 742, and 749 and signal paths 751, 752, and 759 associated with portions 731, 732, and 799 of connections 720. As shown in FIG. 7, signal path 751 may include two segments. A first segment of signal path 751 may be coupled between portion 731 and rerouting logic 713 through corresponding circuit unit 741. A second segment of signal path 751 may be coupled between rerouting logic 713 and circuit components 715. Similarly, as shown in FIG. 7, each of signal paths 752 and 759 may include segments coupled to portions 732 and 799, rerouting logic 713, and circuit components 715.

Circuit components 715 may include memory cells, decode circuits, control circuits, or other components of a memory device that may be similar to or identical to components such as memory cells 235, decode circuits 236, and control circuits 238 of memory device 200 of FIG. 2. Memory device 777 may use signal paths 751, 752, and 759 to transfer information between connections 720 and circuit components 715. The information may include information such as data to be written into or read from the memory cells, address information to be provided to a decode circuit, or control information to control circuit of memory device 777. Thus, each of signal paths 751, 752, and 759 may be a uni-directional signal path to transfer information in one direction from connections 720 to circuit components 715 or from circuit components 715 to connections 720. Each of signal paths 751, 752, and 759 may also be a bi-directional signal path to transfer information in both directions from connections 720 to circuit components 715 and from circuit components 715 to connections 720.

Each of circuit units 741, 742, and 749 may include a receiver, a transmitter, or a combination of both receiver and transmitter. For example, each of circuit units 741, 742, and 749 may include a receiver to receive information (e.g., data, address, or control information) from a corresponding portion (e.g., one of portions 731, 732, and 799) of connections 720 in which the information may then be transferred to circuit components 715 by rerouting logic 713. In another example, each of circuit units 741, 742, and 749 may also include a transmitter to send information (e.g., data or control information) to a corresponding portion of connections 720 in which the information may be originated from circuit components 715 and then transferred to the corresponding portion by rerouting logic 713. In another example, each of circuit units 741, 742, and 749 may include both a receiver and a transmitter (e.g., a transceiver) to receive information from or to send information to a corresponding portion. Memory device 777 may enable or disable one or more of circuit units 741, 742, and 749 based on whether the corresponding portion (one of portions 731, 732, and 799) is defective or non-defective, as described below.

Repair logic 712 may use registers 761, 762, and 769 to set indications to indicate which one of portions 731, 732, and 799 is defective and which one is non-defective. As shown in FIG. 7, each of registers 761, 762, and 769 may be associated with one of circuit units 741, 742, and 749 and one of portions 731, 732, and 799 of connections 720. Each of registers 761, 762, and 769 may store a value (e.g., a state). Repair logic 712 may set in each of registers 761, 762, and 769 an indication to indicate which portion of connections 720 is defective and which portion is non-defective. For example, each of registers 761, 762, and 769 may set the indication by storing a single bit with a value of either "0" or "1". In this example, repair logic 712 may set a value (e.g., a state) in each of registers 761, 762, and 769 to a first value (e.g., "0") if the portion of connections 720 (one of portions 731, 732, and 799) associated with that register is defective, and set the value to a second value (e.g., "1") if the portion of connections 720 associated with that register is non-defective. Repair logic 712 may communicate with a scan logic that check for defects (e.g., scan logic similar to or identical to scan logic 514 of FIG. 5) to set values in registers 761, 762, and 769 based on the results of the check for defects.

Rerouting logic 713 may reroute information to be transferred on a defective portion to a non-defective portion based on the values in registers 761, 762, and 769. For example, rerouting logic 713 may be configured such that it may reroute information to be transferred on portion 731 or 732 to portion 799 if either portion 731 or 732 is defective and portion 799 is non-defective. Rerouting logic 713 may include a multiplexing network that may reroute the information at its terminals DATA1, DATA2, and DATA3 based on control signals (e.g., multiplexing control signals) at terminals CTL1, CLT2, and CTL3. As shown in FIG. 7, terminals CTL1, CLT2, and CTL3 may be coupled to lines 781, 782, and 789 where these lines may have signal values corresponding to the values in registers 761, 762, and 769. Thus, terminals CTL1, CLT2, and CTL3 may also have signal values that correspond to the values in registers 761, 762, and 769. Since the values in registers 761, 762, and 769 may indicate which portion of connection is defective and which portion of connections is non-defective, the signal values at terminals CTL1, CLT2, and CTL3 may allow rerouting logic 713 to recognize which portion is defective and which portion is non-defective so that it may appropriately reroute information to be transferred on a defective portion to a non-defective portion.

Each of registers 761, 762, and 769 may enable or disable a corresponding one of circuit units 741, 742, and 743 (e.g., through signal on terminal EN of the circuit unit) based on values of information stored in the register. For example, register 761 may enable circuit unit 741 when the value in register is "0" and disable circuit unit 741 when the value in register is "1". When one of registers 761, 762, and 769 enables a corresponding circuit unit, the register may allow the corresponding circuit unit to transfer information (e.g., data) between DATAa and DATAb terminals of the circuit unit. Rerouting logic 713 may transfer information between one of portions 731, 732, and 799 and circuit components 715 through a corresponding enabled circuit unit using the corresponding signal path (one of signal paths 751, 752, and 759). For example, when register 761 enables circuit unit 741 (e.g., "1" is in register 761), register 761 may allow circuit unit 741 to transfer information between its DATAa and DATAb terminals. Thus, rerouting logic 713 may transfer information between portion 731 and circuit components 715 (through the enabled circuit unit 741), using signal path 751. When one of registers 761, 762, and 769 disables a corresponding circuit unit, the register may prevent the corresponding circuit unit from transferring information (e.g., data) between DATAa and DATAb terminals, so that the information may be prevented from being transferred between a corresponding portion (defective portion) of the connection and circuit components 715 (by way of rerouting logic 713). For example, when register 761 disables circuit unit 741 (e.g., "0" is in the register), register 761 may prevent circuit unit 741 from transferring information between its DATAa and DATAb terminals. Thus, rerouting logic 713 may also be prevented from transferring information between portion 731 and circuit components 715 because circuit unit 741 is disabled. When one of circuit unit 741, 742, and 743 is disabled, memory device 777 may couple one or both of the DATAa and DATAb terminals of the disabled circuit unit to one a fixed state (e.g., to supply voltage Vcc or to ground) to prevent one or both of the DATAa and DATAb terminals from "floating". Memory device 777 may also cut off power to the disabled circuit unit to save power.

The following example describes activities that memory device 777 may perform to repair a defective portion of connections 720. In this example, portion 731 is assumed to be a defective portion that memory device 777 may have already determined to be defective (e.g., by using circuitry and activities similar to or identical to those described above with reference to FIG. 5 to check for defects). Based on this example, repair logic 712 may set registers 761, 762, and 769 with values "0", "1", and "1", respectively, to indicate that portion 731 is defective (corresponding to register 761 with value "0") and portions 732, and 799 are non-defective (corresponding to registers 761 and 769 with "1" values). Thus, in this example, register 761 may disable circuit unit 741 to prevent it from transferring information. Registers 762 and 769 may enable circuit units 742 and 769 to allow them to transfer information. Rerouting logic 713 may be configured such that it may reroute information to be transferred on portion 731 or 732 to portion 799 if either portion 731 or 732 is defective. In this example, since portion 731 is defective, rerouting logic 713 may reroute information to be transferred on portion 731 to portion 799 based on control values at terminals CLT1, CTL2, and CLT3. In this example, the control values may reflect the values in registers 761, 762, and 769 (e.g., values "0", "1", and "1"). Since terminals CLT1, CTL2, and CLT3 have values "0", "1", and "1", rerouting logic 713 may reroute information intended to be transferred on signal path 751 (associated with defective portion 731) to signal path 759 (associated with the replacement portion).

As described above, memory device 777 may include dice arranged in a stack similar to or identical to stack 407 of memory device 444 of FIG. 4. Thus, memory device 777 of FIG. 7 may include other dice where each of the other dice may have circuitry including a repair logic and rerouting logic similar to or identical to repair logic 712 and rerouting logic 713 of die 705. Connections 720 in FIG. 7 may also be coupled to the other dice (besides die 705 of FIG. 7) of memory device 777 to form conductive paths similar to or identical to the conductive paths (shown as a broken line in FIG. 4) that go through dice 401, 402, 403, and 404 in FIG. 4. For example, portions 731, 732, and 799 of FIG. 7 may also be coupled to other corresponding portions (portions similar to or identical to portions 731, 732, and 799) of the other dice of memory device 777 to form conductive paths going through the dice of memory device 777. If one portion (e.g., portion 731 die 705 of FIG. 7) among portions that form a particular conductive path is defective, then not only the defective portion but all portions forming that particular conductive path may have to be replaced to allow continuity of the transfer of signals among the dice memory device 777. If only the die having a defective portion replaces that defective portion (the portion among portions that form the same conductive path with other dice), then discontinuity of the transfer of signals among the dice may occur because the die having the defective portion may reroute the signal to a new portion (e.g., replacement portion) while the other dice may still route the signal using the same portions that form the conductive path, which still has the defective portion. Therefore, in FIG. 7, when die 705 indicates that a portion of connections 720 is defective (e.g., portion 731 of die 705), each of the other dice of memory device 777 may also indicate that a corresponding portion (portion that is coupled to the defective portion of die 705, e.g., portion 731) is defective, even if the corresponding portion of each of the other dice may be non-defective. Giving the same indication to corresponding portions (defective and non-defective portions that form the same conductive path) among the dice of memory device 777 may allow the dice to reroute the signal that is to be transferred to corresponding portions in the same way (reroute to the same placement portions), thereby continuity of the transfer of signals and appropriate communication among the dice may be maintained.

In the above description about repairing defects in connections 720 with reference to FIG. 7, repair logic 712 may set values in registers 761, 762, and 769 each time memory device 777 is powered-up (e.g., performing an initialization process) to indicate that a portion of connections 720 is defective if connections 720 has a defective portion. Thus, register 761, 767, and 769 may not permanently store values to indicate which portion of connections 720 are defective (e.g., the values in register 761, 767, and 769 reset to default values, such as values of "1", when power is disconnected from memory device 777). Repair logic 712 may also include circuit elements 716 to permanently indicate which portion or portions of connections 720 are defective. Circuit elements 716 may include elements such as antifuses, flash memory cells, or other elements. Each of circuit elements 716 may be associated with one of with one of circuit units 741, 742, and 749 and one of portions 731, 732, and 799 of connections 720. Based on results from the checks for defects (e.g., performed by a scan logic), repair logic 712 may selectively set an indication (e.g., store values in flash memory cells or "burn" the antifuses to put the antifuses in one of two different positions) to indicate which portion of connections 720 is defective.

For example, repair logic 712 may store a value in a selected flash memory cell to indicate a portion of connections 720 associated with the selected flash memory cell is defective. In another example, repair logic 712 may set a selected antifuse to a closed position to indicate a portion of connections 720 associated with the selected antifuse is defective (the selected antifuse may be in an open position (e.g., default position) to indicate that the portion is non-defective). As is known to those skilled in the art, an antifuse may normally be in an open position; it may be set to a closed position by, e.g., applying a relatively high voltage (e.g., higher than the supply voltage of memory device 777) to a terminal of the antifuse. Based on the indications in circuit elements 716 (e.g., antifuses, flash memory cells, or both), rerouting logic 713 may appropriately reroute information to be transferred on a defective portion of connections 720 to a non-defective (replacement) portions of connections 720. As described above, rerouting logic 713 may reroute the information at its terminals DATA1, DATA2, and DATA3 based on control signals at terminals CTL1, CLT2, and CTL3. The values of control signals at terminals CTL1, CLT2, and CTL3 may reflect the indications (e.g., values in flash memory cells or positions of the antifuses) of circuit elements 716 so that rerouting logic 713 may reroute information to appropriate portions of connections 720 in ways similar to those described above.

Repair logic 712 may set indications in circuit elements 716 (e.g., at the factory where memory device 777 is made) only once, based on results of the check for defects, to permanently indicate which portion or portions of connections 720 are defective. Repair logic 712 may also set values in registers 761, 762, and 769 to indicate which portion or portions of connections 720 are defective each time memory device 777 is powered-up. For example, after memory device 777 is installed in a system such as a computer or a cellular phone, memory device 777 may check for defects in connections 720 each time it is powered-up or turned on. Thus, each time memory device 777 is powered-up, repair logic 712 may also set values in registers 761, 762, and 769 (based on the results of the check for defects) to indicate which portion or portions of connections 720 are defective.

The description above with reference to FIG. 1 through FIG. 7 describes circuitry and activities to check for defects and repair defects in apparatus and memory devices such as apparatus 100 and memory device 222, 333, 444, 555, and 777. The apparatus and memory devices may be a part of a system such as the system of FIG. 8.

Figure 8:
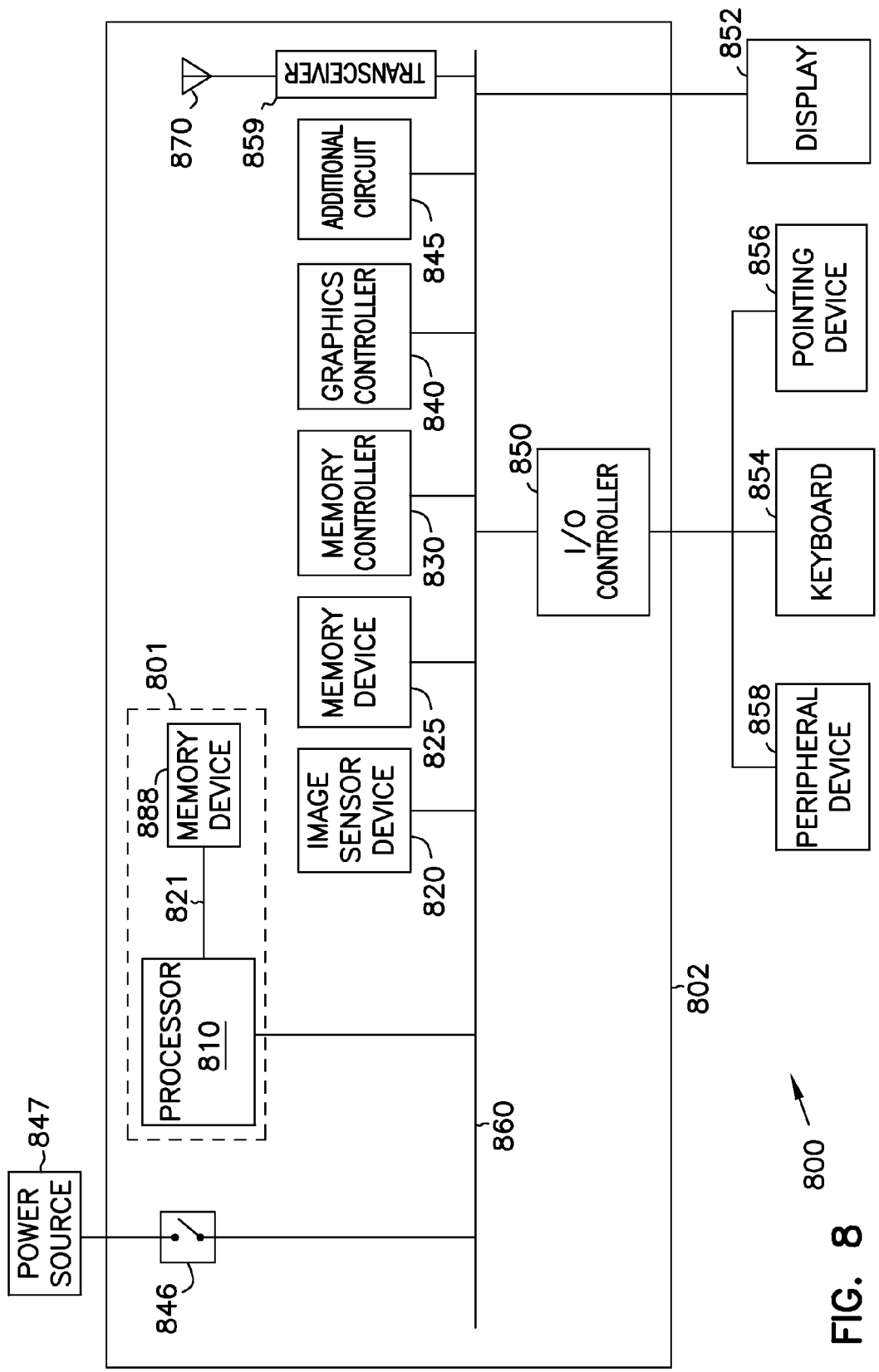
FIG. 8 shows a block diagram of a system according to an embodiment of the invention.

FIG. 8 shows a system 800 according to an embodiment of the invention. System 800 may include a processor 810, a first memory device 888, an image sensor device 820, a second memory device 825, a memory controller 830, a graphics controller 840, an additional circuit 845, an input and output (I/O) controller 850, a display 852, a keyboard 854, a pointing device 856, a peripheral device 858, and a system transceiver 859. System 800 may also include a bus 860 to transfer information among the components of system 800 and provide power to at least some of these components, a circuit board 802 where some of the components of system may be attached, and an antenna 870 to wirelessly transmit and receive information to and from system 800. System transceiver 859 may operate to transfer information from one or more of the components of system 800 (e.g., at least one of processor 810 and memory device 825) to antenna 870. System transceiver 859 may also operate to transfer information received at antenna 870 to at least one of the processor 810 and at least one of memory devices 825 and 888. The information received at antenna 870 may be transmitted to system 800 by a source external to system 800.

System 800 may also include a switch 846 (e.g., a push button switch) coupled to bus 860 and a supply power source 847 to turn on system 800. Each time switch 846 turns on system 800, it may apply power from power source 847 at least one of the components of system 800 such as to processor 810, memory device 888, or both.

Processor 810 may include a general-purpose processor or an application specific integrated circuit (ASIC). Processor 810 may include a single core processor or a multiple-core processor. Processor 810 may execute one or more programming commands to process information. The information may include digital output information provided by other components of system 800, such as by image sensor device 820 or memory device 825.

Each of memory devices 825 and 888 may include a volatile memory device, a non-volatile memory device, or a combination of both. For example, memory device 825 may comprise a dynamic random access memory (DRAM) device, a static random access memory (SRAM) device, a flash memory device, or a combination of these memory devices. Each of memory devices 825 and 888 may include one or more of the various embodiments described herein, such as apparatus 100 and memory devices 222, 333, 444, 555, and 777 described above with reference to FIG. 1 through FIG. 7. Thus, each of memory devices 825 and 888 include circuitry and circuit components (similar to or identical to those described above with reference to FIG. 1 through FIG. 7) to check for defects and repair defects in connections in memory device 825 or 888. Memory devices 825 and 888 may check for defects in and repair defects each time they are powered-on or go through an initialization process. For example, memory devices 825 and 888 may check for defects each time switch 846 turns on the system 800.

Some components of system 800 may be grouped together such that system 800 may include a so-called system in package (SIP). For example, at least memory device 888 and processor 810 may be a part of an SIP 801 or the entire SIP 801 in which memory device 888 may be used as a cache memory of processor 810, (e.g., level L1 cache, level L2 cache, level L3 cache, or a combination of thereof). Processor 810 and memory device 888 may communicate with each other through connections 821, which may be similar to or identical to connections 121 of FIG. 2. Connections 821 in FIG. 8 may include connections that may be similar to or identical to connections 120, 220, 320, 420, 520, and 720 of FIG. 1 through FIG. 7.

Image sensor device 820 may include a complementary metal-oxide-semiconductor (CMOS) image sensor having a CMOS pixel array or charge-coupled device (CCD) image sensor having a CCD pixel array.

Display 852 may include an analog display or a digital display. Display 852 may receive information from other components. For example, display 852 may receive information that is processed by one or more of image sensor device 820, memory device 825, graphics controller 840, and processor 810 to display information such as text or images.

Additional circuit 845 may include circuit components used in a vehicle. Additional circuit 845 may receive information from other components to activate one or more subsystem of the vehicle. For example, additional circuit 845 may receive information that is processed by one or more of image sensor device 820, memory device 825, and processor 810, to activate one or more of an air bag system of a vehicle, a vehicle security alarm, and an obstacle alert system.

The illustrations of apparatus (e.g., apparatus 100 and memory devices 222, 333, 444, 555, and 777) and systems (e.g., system 800) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatus 100 and memory devices 222, 333, 444, 555, and 777 including circuitry, circuit components, and logic thereof, such as scan logic 514 of FIG. 4, repair and rerouting logics 712 and 713 of FIG. 7) and systems (e.g., a portion of system 800 or the entire system 800) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatus 100 and memory devices 222, 333, 444, 555, and 777) and systems (e.g., system 800), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The novel apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 9:
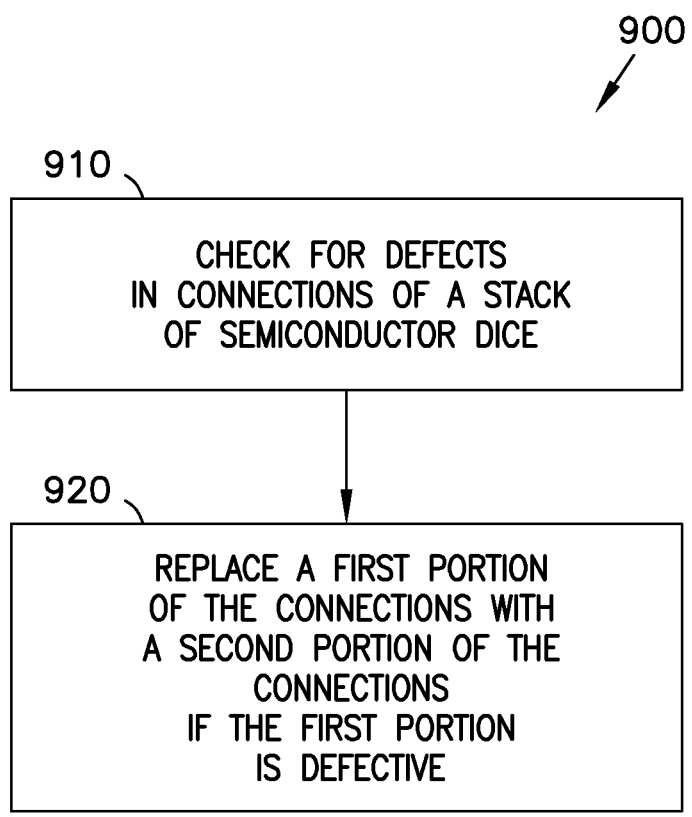
FIG. 9 is a flow diagram of methods of checking and repairing defects in connections in a stack of dice according to an embodiment of the invention.

FIG. 9 is a flow diagram of methods 900 of checking and replacing defects in connections in a stack of semiconductor dice according to an embodiment of the invention. Methods 900 may be used in apparatus 100 and memory devices 222, 333, 444, 555, 777, 825, and 888 described above with reference to FIG. 1 through FIG. 8. Thus, the components used in methods 900 may include components of apparatus 100 and memory devices 222, 333, 444, 555, 777, 825, and 888 described above with reference to FIG. 1 through FIG. 8. Methods 900 may also include activities such as checking for defects and repairing defects that may be similar to or identical to those described above with reference to FIG. 1 through FIG. 8.

Activity 910 of methods 900 may include checking for defects connections coupled to dice arranged in a stack. The dice may include components of a device such as a memory device such that at least one of the dice may include an array of memory cells. The connections coupled to the dice in methods 900 may be similar to or identical to connections 120, 220, 320, 420, 520, and 720 described above with reference to FIG. 1 through FIG. 7. Checking for defects in activity 910 may include at least scanning the connections using scan cells coupled to the connections and identifying defective and non-defective portions of the connections. Checking for defects in activity 910 may be similar to or identical to those of activities described above with reference to FIG. 5 and FIG. 6.

Activity 920 of methods 900 may include replacing a first portion of the connections with a second portion of the connections if the first portion is defective. Replacing the first portion in activity 920 may include indicating a portion of the connections that is determined to be defective and rerouting signals to be transferred on the defective portion to another portion that is determined to be non-defective. Rerouting in methods 900 may include transferring information to a first portion of the connections (e.g., a first portion of connections 120, 220, 320, 420, 520, 720, and 821 of FIG. 1 through FIG. 8), and rerouting the information to a second portion of the connections (e.g., a second portion of connections 120, 220, 320, 420, 520, 720, and 821 of FIG. 1 through FIG. 8) due to the first portion being defective.

Activity 920 may replace one or more defective portions with one or more non-defective portions before the dice in the stack are covered by an IC package (e.g., stack 507 in IC package 400 of FIG. 4), after the dice in the stack are covered by an IC package, or both before and after the dice are covered by an IC package. For example, activity 920 may replace one or more defective portions with one or more non-defective portions at a factory before the dice in the stack are covered by an IC package. In another example, activity 920 may replace one or more defective portions with one or more non-defective portions after the dice in the stack are covered by an IC package. In this example, the IC package may be already installed in a system such as a computer or a cellular phone. Activity 920 may include activities similar to or identical to those of activities described above with reference to FIG. 7.

One or more embodiments described herein include apparatus, systems, and methods comprising semiconductor dice arranged in a stack, a number of connections configured to provide communication among the dice, at least a portion of the connections going through at least one of the dice, and a module configured to check for defects in the connections and to repair defects in the connections. Other embodiments including additional apparatus, systems, and methods are described above with reference to FIG. 1 through FIG. 9.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
   receiving information at a first scan cell in dice arranged in a stack, the information being provided from a first portion of connections, at least some of the connections going through at least one of the dice;
   transferring the information from the first scan cell to a second scan cell;
   transferring the information from the second scan cell to a third scan cell;
   transferring the information from the third scan cell to a second portion of connections; and
   checking for defects in the connections based on a value of the information provided from the first portion of connections and a value of the information received at the second portion of connections.

2. The method of claim 1, wherein transferring the information from the first scan cell to the second scan cell includes shifting the information from an output of the first scan cell to an input of the second scan cell in response to a first level of a signal.

3. The method of claim 2, wherein receiving information at a first scan cell is in response to a second level of the signal.

4. The method of claim 1, wherein checking for defects in the connections includes comparing the value of the information provided from the first portion of connections with the value of the information received at the second portion of connections.

5. The method of claim 1, wherein transferring the information from the first scan cell to the second scan cell and transferring the information from the second scan cell to the third scan cell is in response to a same signal provided to the first, second, and third scan cells.

6. The method of claim 5, further comprising:
   providing the signal to a third portion and a fourth portion of the connections, wherein the third portion and the fourth portion are duplicates of each other.

7. The method of claim 1, further comprising:
   determining that the first portion of connections is defective if the value of the information provided from the first portion of connections and the value of the information received at the second portion of connections are unmatched.

8. The method of claim 1, further comprising:
   replacing the first portion of connections with a non-defective portion of the connections if the first portion of connections is defective based on the checking for defects in the connections.

9. The method of claim 1, further comprising:
   receiving an additional information at the second scan cell, the additional information being provided from an additional portion of connections;
   transferring the additional information from the second scan cell to the third scan cell; and
   transferring the additional information from the third scan cell to the second portion of connections.

10. The method of claim 9, wherein transferring the information from the first scan cell to the second scan cell and transferring the additional information from the second scan cell to the third scan cell is in response to a same signal provided to the first, second, and third scan cells.

11. The method of claim 9, further comprising:
    checking for defects in the connections based on a value of the additional information provided from the additional portion of connections and a value of the additional information received at the second portion of connections.

12. The method of claim 1, further comprising:
    comparing a value of a bit of the information from the first portion of the connections with a value of a bit of the information from the second portion of the connections to produce a comparison result.

13. The method of claim 12, further comprising:
    indicating whether the first portion of the connections is defective based on the comparison result.

14. The method of claim 1, further comprising:
    indicating whether the second portion of the connections is defective based on a result of the checking for defects in the connections.

15. The method of claim 1, further comprising:
    storing an indication of whether the first portion of the connections is defective based on a result of the checking for defects in the connections.

16. The method of claim 15, further comprising:
    storing an indication of whether the second portion of the connections is defective based on a result of the checking for defects in the connections.

17. A method comprising:
    receiving, at a first scan cell, information from a first portion of the connections in dice arranged in a stack;
    performing at least one of transferring the information from the first scan cell to an additional scan cell, transferring the information from the additional scan cell to a second portion of connections; and
    checking for defects in the connections based on the information received from the first portion of the connections and the information received from the second portion of the connections.

18. The method of claim 17, wherein checking for defects in the connections includes transferring a bit from the first portion to a third portion of the connections to the second portion of connections.

* * * * *